(12) United States Patent
Lim et al.

(10) Patent No.: US 12,396,124 B2
(45) Date of Patent: Aug. 19, 2025

(54) FAN MODULE INTERCONNECT APPARATUS FOR ELECTRONIC DEVICES

(71) Applicant: Intel Corporation, Santa Clara, CA (US)

(72) Inventors: Chee How Lim, Bukit Mertajam (MY); Khai Ern See, Batu Gaja (MY); Chin Kung Goh, Pulau Pinang (MY); Twan Sing Loo, Butterworth (MY)

(73) Assignee: Intel Corporation, Santa Clara, CA (US)

( * ) Notice: Subject to any disclaimer, the term of this patent is extended or adjusted under 35 U.S.C. 154(b) by 774 days.

(21) Appl. No.: 17/132,846

(22) Filed: Dec. 23, 2020

(65) Prior Publication Data

US 2021/0120699 A1 Apr. 22, 2021

(51) Int. Cl.
*H05K 7/20* (2006.01)
*G06F 1/20* (2006.01)

(52) U.S. Cl.
CPC ......... *H05K 7/20172* (2013.01); *G06F 1/203* (2013.01); *G06F 2200/201* (2013.01)

(58) Field of Classification Search
CPC ....................................................... H05K 5/00
See application file for complete search history.

(56) References Cited

U.S. PATENT DOCUMENTS

| | | |
|---|---|---|
| 3,401,369 A | 9/1968 | Palmateer et al. |
| 3,904,934 A | 9/1975 | Martin |
| 4,628,407 A | 12/1986 | August et al. |
| 4,731,701 A | 3/1988 | Kuo et al. |
| 4,860,165 A | 8/1989 | Cassinelli |
| 4,884,168 A | 11/1989 | August et al. |
| 5,030,113 A | 7/1991 | Wilson |
| 5,307,519 A | 4/1994 | Mehta et al. |
| 5,323,293 A | 6/1994 | Angiulli et al. |
| 5,432,673 A | 7/1995 | Ogami |
| 5,638,895 A | 6/1997 | Dodson |
| 5,768,104 A | 6/1998 | Salmonson et al. |
| 5,808,870 A | 9/1998 | Chiu |
| 5,862,037 A | 1/1999 | Behl |
| 6,034,871 A | 3/2000 | Cheng |

(Continued)

FOREIGN PATENT DOCUMENTS

| | | |
|---|---|---|
| CN | 201226637 Y | 4/2009 |
| CN | 102045989 A1 | 5/2011 |

(Continued)

OTHER PUBLICATIONS

European Patent Office, "European Search Report Pursuant to Rule 62 EPC", issued in connection with European Patent Application No. 21198564.3-1007 on Mar. 1, 2022, 8 pages.

(Continued)

*Primary Examiner* — Jerry Wu
(74) *Attorney, Agent, or Firm* — Hanley, Flight & Zimmerman, LLC

(57) ABSTRACT

Fan module interconnect apparatus are disclosed. An example fan module includes a fan and a fan housing to carry the fan. The fan is to rotate in the fan housing. A flange extends from the fan housing and including signal paths to provide an interconnect to electrically couple at least portions of a first electrical circuit and a second electrical circuit of an electronic device.

14 Claims, 8 Drawing Sheets

(56) References Cited

U.S. PATENT DOCUMENTS

| | | | |
|---|---|---|---|
| 6,058,009 | A | 5/2000 | Hood, III et al. |
| 6,072,696 | A | 6/2000 | Horii |
| 6,188,573 | B1 | 2/2001 | Urita |
| 6,212,071 | B1 | 4/2001 | Roessler et al. |
| 6,226,178 | B1 | 5/2001 | Broder et al. |
| 6,633,486 | B2 | 10/2003 | Coles |
| 6,778,390 | B2 | 8/2004 | Michael |
| 6,914,782 | B2 | 7/2005 | Ku |
| 6,934,152 | B1 | 8/2005 | Barrow |
| 6,999,313 | B2 | 2/2006 | Shih |
| 7,095,615 | B2 | 8/2006 | Nichols |
| 7,855,886 | B1 | 12/2010 | Chen |
| 8,000,099 | B2 | 8/2011 | Parker |
| 8,693,196 | B2 | 4/2014 | Wu |
| 8,717,762 | B2 | 5/2014 | Fujiwara |
| 8,735,728 | B2 | 5/2014 | Cheng |
| 9,258,929 | B2 | 2/2016 | Zhang |
| 9,674,986 | B2 | 6/2017 | Pope et al. |
| 9,685,598 | B2 | 6/2017 | Marc |
| 10,327,325 | B2 | 6/2019 | Edlinger et al. |
| 10,462,935 | B2 | 10/2019 | Farshchian et al. |
| 11,106,256 | B2 | 8/2021 | Shu et al. |
| 11,262,820 | B1 | 3/2022 | North |
| 11,262,821 | B1 | 3/2022 | North et al. |
| 11,507,156 | B2 | 11/2022 | He et al. |
| 2002/0185259 | A1 | 12/2002 | Park |
| 2003/0202306 | A1 | 10/2003 | Dubhashi |
| 2003/0227443 | A1 | 12/2003 | Kyouzuka |
| 2004/0163795 | A1 | 8/2004 | Lin |
| 2005/0207113 | A1 | 9/2005 | Tanaka et al. |
| 2005/0270711 | A1 | 12/2005 | Marholev |
| 2006/0007145 | A1* | 1/2006 | Naghi ............... G06F 3/03543 345/163 |
| 2006/0082966 | A1 | 4/2006 | Lev |
| 2006/0109619 | A1 | 5/2006 | Ito |
| 2006/0152484 | A1* | 7/2006 | Rolus Borgward .... G06F 3/038 345/157 |
| 2007/0121292 | A1 | 5/2007 | Ariga |
| 2008/0062645 | A1 | 3/2008 | Ijima |
| 2008/0115914 | A1 | 5/2008 | Yang |
| 2010/0238628 | A1 | 9/2010 | Hung |
| 2010/0310916 | A1 | 12/2010 | Coish |
| 2018/0091987 | A1 | 3/2018 | Miele |
| 2018/0168070 | A1 | 6/2018 | Ware et al. |
| 2019/0264696 | A1 | 8/2019 | Tsukamoto et al. |
| 2021/0120699 | A1 | 4/2021 | Lim et al. |
| 2021/0191461 | A1 | 6/2021 | Jaggers et al. |
| 2021/0333848 | A1 | 10/2021 | Ku |
| 2023/0022182 | A1 | 1/2023 | Paavola et al. |
| 2025/0008684 | A1 | 1/2025 | Ku |

FOREIGN PATENT DOCUMENTS

| | | |
|---|---|---|
| CN | 102647880 A | 8/2012 |
| CN | 102789292 A | 11/2012 |
| CN | 105867566 A | 8/2016 |
| JP | 2010140194 A | 6/2010 |
| JP | 2017146894 A | 8/2017 |

OTHER PUBLICATIONS

United States Patent and Trademark Office, "Non-Final Office Action," issued in connection with U.S. Appl. No. 18/200,994, dated Jan. 30, 2025, 13 pages.

Ung, "Hands-on with HP's Spectre 13.3, the world''s thinnest laptop", PCWorld, Apr. 5, 2016, retrieved on May 22, 2023 from <https://www.pcworld.com/article/420276/hands-on-with-hps-spectre-133-worlds-thinnest-laptop.html>, 7 pages.

Goel, "The HP Spectre: What's Inside This Ultra-Thin Laptop," May 4, 2016, retrieved on May 22, 2023 from <https://www.engineering.com/story/the-hp-spectre-whats-inside-this-ultra-thin-laptop>, 9 pages.

International Searching Authority, "International Search Report," issued in connection with International Patent Application No. PCT/CN2018/072410, mailed on Oct. 12, 2018, 4 pages.

International Searching Authority, "Written Opinion of the International Searching Authority," issued in connection with International Patent Application No. PCT/CN2018/072410, mailed on Oct. 12, 2018, 4 pages.

International Searching Authority, "International Preliminary Report on Patentability," issued in connection with International Patent Application No. PCT/CN2018/072410, mailed on Jul. 23, 2020, 6 pages.

United States Patent and Trademark Office, "Non-Final Action" issued in U.S. Appl. No. 16/648,595, on Nov. 4, 2020 (12 pages).

United States Patent and Trademark Office, "Final Action," issued in U.S. Appl. No. 16/648,595, on Mar. 25, 2021 (16 pages).

United States Patent and Trademark Office, "Notice of Allowance," issued in U.S. Appl. No. 16/648,595, on May 10, 2021 (8 pages).

European Patent Office, "European Search Report," in connection with European Patent Application No. 21198564.3, issued on Mar. 1, 2022, 6 pages.

European Patent Office, "European Search Report," in connection with European Patent Application No. 21198564.3, issued on Mar. 1, 2022, 2 pages.

European Patent Office, "Extended European Search Report," issued in connection with European Patent Application No. 21198564.3-1007 on Mar. 1, 2022, 5 pages.

Lamarco, "The 8 Best Laptop Cooling Pads of 2023," Mar. 2, 2023, retrieved on Apr. 25, 2023, from <https://www.lifewire.com/best-laptop-cooling-pads-4149823>, 20 pages.

Newcome-Beill, "Asus new ROG 6 gaming phone is on sale in North America," retrieved on Apr. 25, 2023 from <https://www.theverge.com/2022/9/8/23342614/asus-rog-6-gaming-phone-preorder-north-america>, 3 pages.

United States Patent and Trademark Office, "Non-Final Office Action," issued in connection with U.S. Appl. No. 17/131,166, dated Feb. 9, 2024, 10 pages.

European Patent Office, "Communication under Rule 71(3) EPC," issued in connection with European patent Application No. 21198564.3-1004, dated Mar. 12, 2024, 39 pages.

Cooling pad for laptop, 1 page.

Cooling accessory for phone, 1 page.

European Patent Office, "European Search Report Pursuant to Rule 62 EPC," issued in connection with European Patent Application No. 23213829.7-1218 on Jun. 3, 2024, 11 pages.

United States Patent and Trademark Office, "Notice of Allowance and Fee(s) Due," issued in connection with U.S. Appl. No. 18/200,994, dated May 13, 2025, 8 pages.

* cited by examiner

FAN MODULE INTERCONNECT APPARATUS FOR ELECTRONIC DEVICES

FIELD OF THE DISCLOSURE

This disclosure relates generally to hardware and, more particularly, to fan module interconnect apparatus for electronic devices.

BACKGROUND

Electronic devices require thermal systems to manage thermal conditions for maintaining optimal efficiency. To manage thermal conditions, electronic devices employ thermal cooling systems that cool electronic components of the electronic devices during use.

Figure 1:
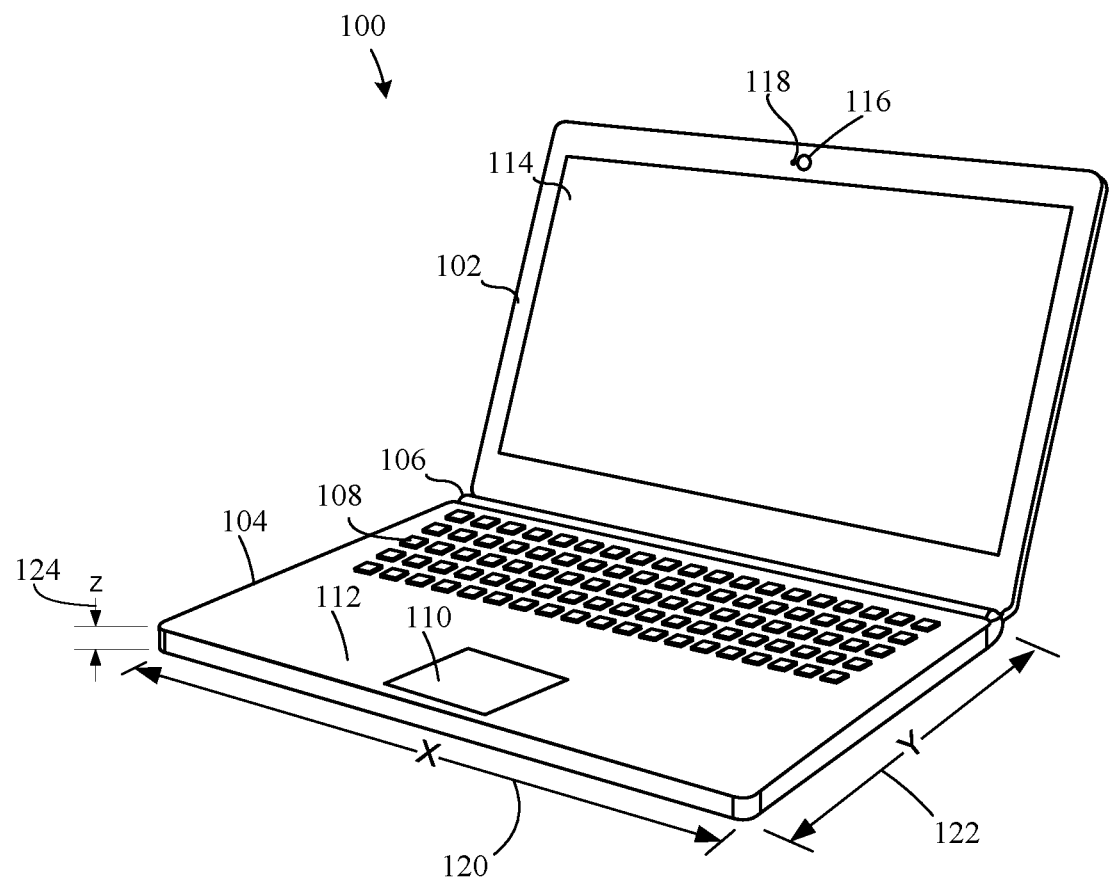
FIG. 1 is an example electronic device constructed in accordance with teachings of this disclosure.

The figures are not to scale. In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

During operation of an electronic device (e.g., a laptop, a tablet, etc.), hardware components disposed in a body or housing of the device, such as a processor, graphics card, and/or battery, generate heat. Heat generated by the hardware components of the electronic device can cause a temperature of one or more electronic components to exceed operating temperature limits of the electronic components.

To prevent overheating of the hardware components, the electronic device includes a thermal management system to dissipate heat from the electronic device. Example thermal management systems can include active cooling systems or passive cooling systems. Passive cooling systems are often employed with processors that do not exceed approximately 10 watts of power. Processors that exceed 10 watts of power often require active cooling systems to effectively cool these processors below desired maximum operating temperatures. Active cooling systems employ forced convention methods to increase a rate of fluid flow, which increases a rate of heat removal.

To exhaust heat or hot air generated within the body of the electronic device and cool the electronic device, active cooling systems often employ external devices such as fans or blowers. Thus, for certain electronic devices (e.g., laptops, tablets, mobile devices, etc.), a fan can provide a thermal solution to safeguard system performance to a target thermal design power. However, active cooling systems employing fans often require additional space. Placement of a fan can be challenging in electronic devices such as, for example, laptops, tablets, mobile devices, etc.) due to space constraints within housings of the electronic devices.

For example, a battery of an electronic device is often positioned in a housing adjacent the electronic components (e.g., the printed circuit board). Thus, space constraints often cause a reduction in either a battery size to include a fan module that is sufficient to meet the thermal needs of a system, or a reduction in fan size to include a battery sufficient to meet system performance in terms of battery life.

To preserve space, a fan module of an active cooling system can be placed between a main circuit board (e.g., a mother board) and one or more auxiliary circuit boards (e.g., daughter boards) such that the main circuit board is spaced or separated from the auxiliary circuit board. To electrically couple or interconnect the main circuit board and the auxiliary circuit board, the electronic device can employ one or more communication cables (e.g., an ATA or Advanced Technology Attachment, SATA cable, etc.). However, to prevent the cable from interfering with airflow of a fan, the communication cable should be circumspectly routed around the fan. Thus, additional space requirements may be needed to ensure that the communication cable(s) does not impede the fan airflow.

In some examples, at least a portion of a fan module can be located in a cutout formed in a circuit board (e.g., a single board). In some examples, at least a portion of a fan module can be located between a first circuit board and a second circuit board. In some such examples, the fan module may be partially surrounded by portions of the circuit board. To provide a signal path between respective ends of the circuit board positioned on either side of the fan module, a circuit board can be extended in an area adjacent the fan module. Such signal path of the circuit board includes communication paths (e.g., signal paths or electrical traces) for communicating between electronic components of the circuit board positioned on either side of the fan module.

In some examples, electronic devices employ thinner circuit boards and/or small surface area or footprint (e.g., width and height (x-y) board architecture) to provide a smaller form factor. As used herein, x-direction refers to a direction along a width of an electronic device (e.g., a direction between lateral or side edges), y-direction refers to a direction along a height of an electric device (e.g., a direction between a front edge and a rear edge of an electronic device), and z-direction refers to a direction along a depth of an electronic device (e.g., between a lower surface and an upper surface of a housing of an electronic device) Thus, such dense communication areas cannot be expanded and, as a result, provide a relatively narrow signal path (e.g., in a height direction or y-direction), which results in a dense signal processing area of the circuit board. As electronic systems become more complex and electrical interfaces in the electrical systems operate at higher frequencies, dense signal processing areas (such as those adjacent a fan module) can cause significant crosstalk or unwanted signal cross-over between adjacent signal paths in such densely packed spaces. For example, crosstalk may be noise induced by one signal that interferes with another signal, which reduces the performance of the electronic device.

In either example noted above, active cooling systems employing fan modules often impose restrictions to interconnects of integrated circuits. As a result, such restrictions lead to non-optimal system space utilization, which results in a compromise between battery size or fan size.

Active cooling system disclosed herein employ fan module interconnects to electrically couple electronic components of an integrated circuit. Interconnects are structures that electrically couple two or more circuit elements of a circuit board. Thus, example fan modules disclosed herein provide a solution to interconnect instead of imposing restrictions to interconnects of integrated circuits. By utilizing a fan module of an active thermal management system as an interconnect, board space (e.g., in the y-direction) can be reduced, and space utilization can be better optimized such that a larger fan providing greater airflow output can be used for improved thermal performance, a larger sized battery pack for improved battery life performance, and/or a combination of improved thermal efficiency and battery life performance.

Example apparatus disclosed herein provide active cooling systems that reduce space requirements while improving performance. Specifically, the example active cooling systems disclosed herein preserve space while improving thermal efficiency and/or battery life performance. Example active cooling systems disclosed herein employ example fan modules that provide interconnects for integrated circuits. Thus, an example fan module disclosed herein provides a dual purpose of generating airflow to cool electronic components and providing an interconnect for an integrated circuit of an electronic device. For example, an example fan module interconnect disclosed herein provides a board-to-board or board-to system connection for electronic devices (e.g., laptops, mobile devices, tablets, etc.).

Example fan modules disclosed herein employ electrical paths (e.g., electrically conductive traces) for routing signals between circuit boards and/or system components. In some examples, an example fan casing disclosed herein can include a molded interconnect device (MID). For example, the molded interconnect device can include a fan casing formed via injection molding and electrical paths or traces formed on one or more surfaces (e.g., outer surfaces and/or internal surfaces) of the fan casing via Laser Direct Structuring technology. In some examples, example fan modules disclosed herein can be formed via additive manufacturing technology and/or any other technology for forming a single layer and/or multi-layer printed circuit board and/or electrical paths or traces. In some examples, example electrical paths or traces can be printed within multiple layers of an example fan module disclosed herein and are capable of forming different signal design rules (e.g., stripline, dual stripline, high-speed differential type signal, grounding for isolation, signal references, a combination thereof, etc.). In some examples, an example printed electrical path disclosed herein can be laminated and used as an electrical signal path when a fan module is assembled with an electronic device, where the example fan module or casing electrically connects different circuit boards of an electronic device. In other words, example fan modules disclosed herein implemented with electrical paths serve as interconnects to electrically couple two or more electronic components.

FIG. 1 is an example electronic device 100 constructed in accordance with teachings of this disclosure. The electronic device 100 of the illustrated example is a mobile device (e.g., a rugged laptop, a laptop, etc.). The electronic device 100 of the illustrated example includes a first housing 102 coupled to a second housing 104 via a hinge 106. The hinge 106 enables the second housing 104 to rotate or fold relative to first housing 102 between a stored position (e.g., where the second housing 104 is aligned or parallel with the first housing 102) and an open position as shown in FIG. 1 (e.g., where the second housing 104 is non-parallel relative to the first housing 102). In the open position, the second housing 104 can rotate relative to the first housing 102 about the hinge 106 to a desired viewing angle. To enable user inputs, the first housing 102 of the illustrated example includes a keyboard 108 and a track pad 110. For example, the keyboard 108 and the track pad 110 are exposed at an upper surface 112 of the second housing 104 (e.g., opposite a bottom surface). The second housing 104 carries a display 114, a camera 116 and a microphone 118. The first housing 102 houses electronic components of the electronic device 100. The first housing has a width 120 in a x-direction, a height 122 in a y-direction, and a depth 124 in a z-direction. References to the x-y-z direction throughout this specification pertain a direction along the width 120, the height 122, and the depth 124, respectively.

Although the example electronic device 100 of the illustrated example is a laptop, in some examples, the electronic device 100 can be a tablet, a desktop, a mobile device, a cell phone, a smart phone, a hybrid or convertible PC, a personal computing (PC) device, a sever, a modular computing device, a digital picture frame, a graphic calculator, a smart watch, and/or any other electronic device that employs active cooling.

Figure 2:
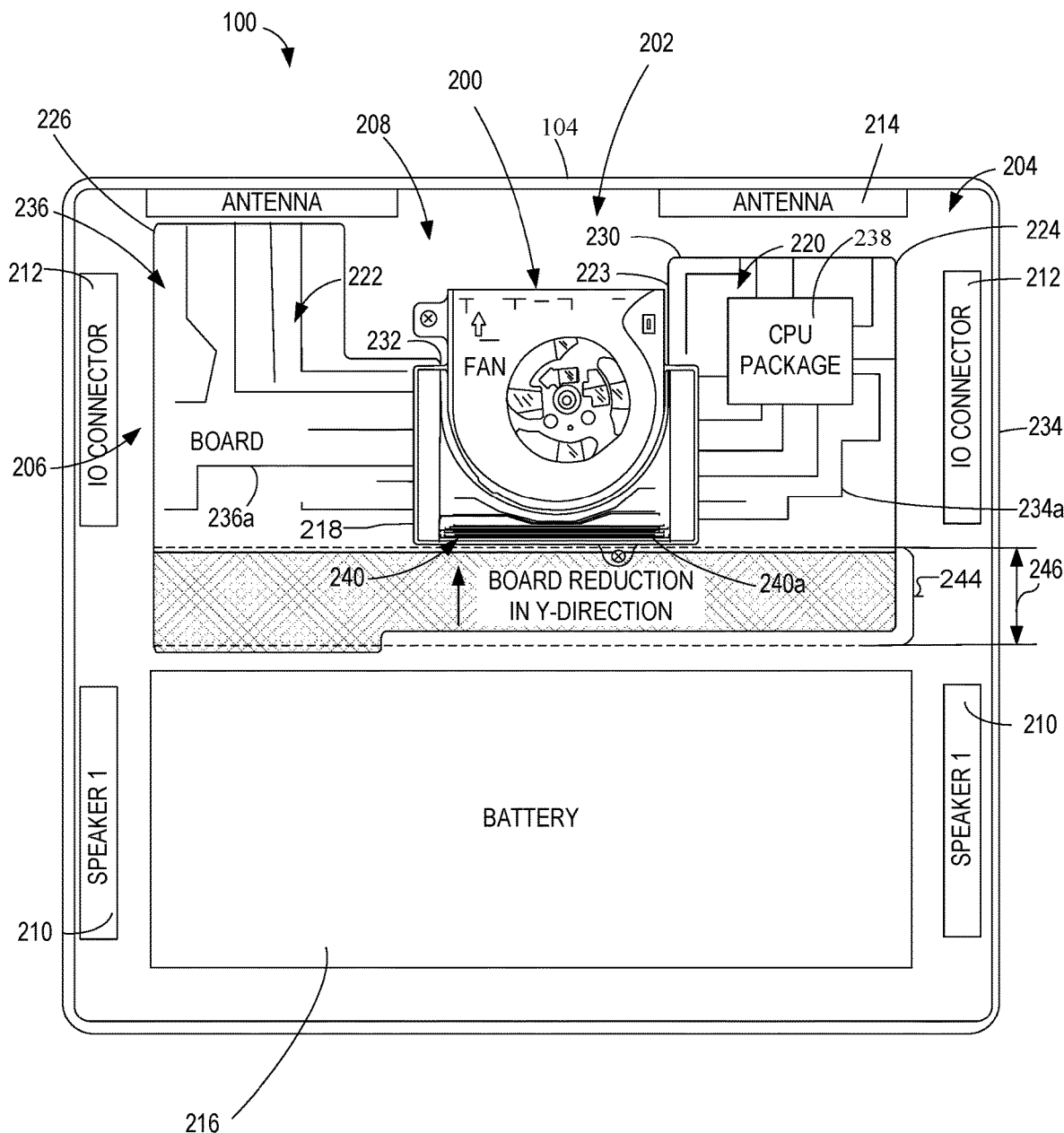
FIG. 2 is a bottom view of the example electronic device of FIG. 1 illustrating an example fan module disclosed herein.

FIG. 2 is a schematic, bottom view of the example second housing 104 of FIG. 1 showing an example fan module 200 disclosed herein. A cover is removed from the second housing 104 to expose an internal cavity 202 (e.g., extending in the z-direction of FIG. 1) of the second housing 104 that houses one or more electronic components 204 of the electronic device 100 including the example fan module 200 disclosed herein. The electronic components 204 include an example circuit board 206 (e.g., a stack up), an example active cooling system 208, example speakers 210, example input/output (I/O) connectors 212, example antennas 214, and an example battery 216. The electronic components 204 can include other components not shown.

As noted above, the fan module 200 of the illustrated example provides an interconnect 218 (e.g., an electrical interconnect device) for electrically coupling at least portions of a first electrical circuit 220 and a second electrical circuit 222 of the electronic device 100. Specifically, the circuit board 206 of the electronic device 100 includes a cutout 223 formed between a first circuit board portion 224 and a second circuit board portion 226. The fan module 200 of the illustrated example is positioned at least partially between the first circuit board portion 224 and the second circuit board portion 226. Specifically, the fan module 200 of the illustrated example is positioned or received by the cutout 223 and couples (e.g., electrically couples) to a first edge 230 of the first circuit board portion 224 and a second edge 232 of the second circuit board portion 226. The circuit board 206 of the illustrated example is a single, one-piece structure having the cutout 223 to receive, at least partially, the fan module 200. In other examples, the circuit board 206 can include a first circuit board that is separate from a second circuit board and the fan module 200 couples the first circuit bard and the second circuit board.

To electrically couple electronic components (e.g., integrated circuits (IC) chips, resistors, capacitors, inductors, diodes, switches, etc.) of the first circuit board portion 224, the first circuit board portion 224 includes one or more first signal paths 234 (e.g., electrical signal paths or traces). To electrically couple electronic components (e.g., integrated circuits (IC) chips, resistors, capacitors, inductors, diodes, switches, etc.) of the second circuit board portion 226, the second circuit board portion 226 includes one or more second signal paths 236 (e.g., electrical signal paths or traces). Specifically, the first circuit board portion 224 of the illustrated example carries or supports a processor 238 (e.g., an integrated circuit (IC) chip, a system on chip (SOC), etc.) that sends and/or receives signals (e.g., electrical signals or instructions) directly or indirectly to and/or from, for example, the speakers 210, the I/O connectors 212, the antennas 214, etc., via the one or more first signal paths 234 of the first circuit board portion 224 and the one or more second signal paths 236 of the second circuit board portion 226.

The fan module 200 of the illustrated example is coupled to the first circuit board portion 224 and the second circuit board portion 226 to provide the interconnect 218 that electrically couples the one or more first signal paths 234 of the first circuit board portion 224 and the one or more second signal paths 236 of the second circuit board portion 226. For example, the fan module 200 communicatively couples the first circuit board portion 224 and the second circuit board portion 226. In other words, the fan module 200 of the illustrated example includes one or more third signal paths 240 to electrically couple the one or more first signal paths 234 and the one or more second signal paths 236. For example, the first signal paths 234, the second signal paths 236 and the third signal paths 240 of the illustrated example define one or more electrical circuits (e.g., circuit patterns, loops, etc.) of the electronic device 100. For example, a first signal path 234a, a second signal path 236a and a third signal path 240a of the illustrated example can define a circuit pattern (e.g., a circuit loop) of the electronic device 100 for coupling the processor 238 and one or more of the other electronic components 204.

The fan module 200 of the illustrated example, providing the interconnect 218 between the first circuit board portion 224 and the second circuit board portion 226, conserves a significant amount of space in the internal cavity 202 of the second housing 104. In particular, the fan module 200 of the illustrated example reduces a circuit board area 244 while maintaining the same and/or providing more signal routing paths (e.g., via the interconnect 218) compared to systems that employ conventional fan modules (e.g., without the interconnect 218 disclosed herein). Specifically, the fan module 200 of the illustrated example reduces a spacing requirement of the circuit board 206 (e.g., the first circuit board portion 224 and the second circuit board portion 226) in the y-direction (e.g., in a direction of the height 122 of FIG. 1). Additionally, the fan module 200 of the illustrated example, via the interconnect 218, reduces a signal density or signal path bottleneck area (e.g., typically routed through the reduced circuit board area 244) of conventional circuit boards.

Reducing the size requirements of the circuit board 206 in the y-direction can improve thermal requirements or performance and/or battery life performance of the electronic device 100. For example, in the illustrated example, the fan module 200 can reduce the circuit board 206 in the y-direction by a distance 246 of approximately between 30 millimeters and 50 millimeters. For example, a 1 millimeter reduction in battery growth in the y-direction can contribute to estimated more than 1 percent of battery capacity growth. Thus, a small change in battery size can significantly affect battery life. Additionally, providing additional space in the internal cavity 202 enables use of a larger size fan module that can provide a larger airflow output, which can greatly improve thermal performance of the active cooling system 208 of the electronic device 100.

Figure 3:
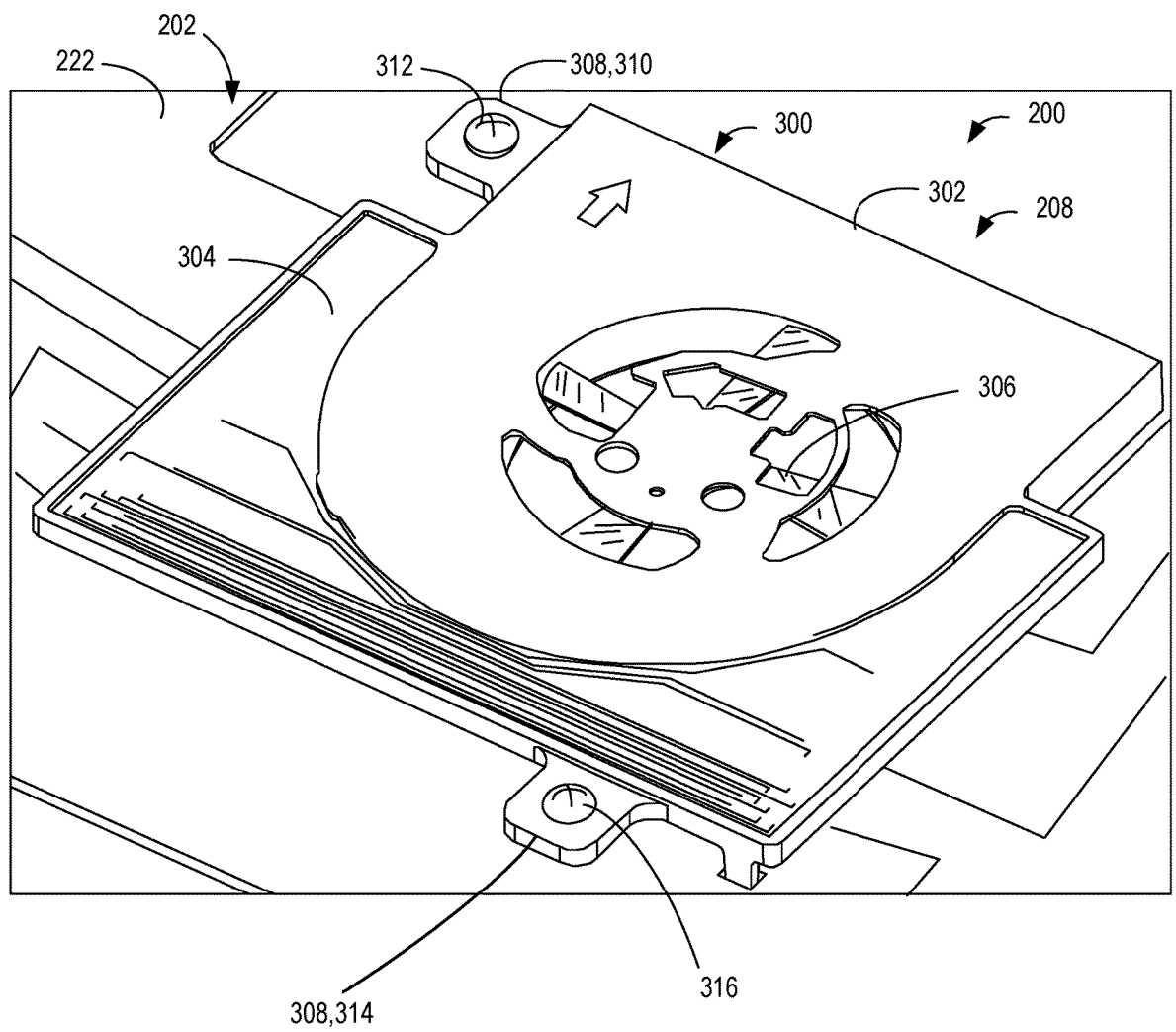
FIG. 3 is partial, perspective view of the example fan module of the example electronic device of FIG. 1.

FIG. 3 is an enlarged, perspective view of the fan module 200 of FIG. 2. The fan module 200 of the illustrated example is a body 300 defining a fan housing 302 (e.g., a fan casing) and a flange 304 (e.g., an interconnect flange). The fan housing 302 is structured to carry a fan 306 of the active cooling system 208. Specifically, the fan 306 of the illustrated example rotates within the fan housing 302 to cool or remove heat from the electronic components 204 (FIG. 2) of the circuit board 206. The flange 304 of the illustrated example extends from the fan housing 302. Specifically, the flange 304 of the illustrated example extends from the fan housing 302 in a direction away from the fan housing 302 (e.g., the y-direction) and extends in the x-direction between the first circuit board portion 224 and the second circuit board portion 226. Specifically, the flange 304 of the illustrated example is positioned between the first edge 230 of the first circuit board portion 224 and the second edge 232 of the second circuit board portion 226. The body 300 of the illustrated example includes a mechanical connector 308 (e.g., a mounting tab or ear) to couple to the fan module 200 to at least one of the first circuit board portion 224, the second circuit board portion 226 and/or (e.g., a frame) of the second housing 104 (FIGS. 1 and 2). In the illustrated example, the fan housing 302 includes a first mounting flange 310 that receives a first fastener 312 (e.g., a screw) and the flange 304 includes a second mounting flange 314 that receive a second fastener 316 (e.g., a screw).

Figure 4:
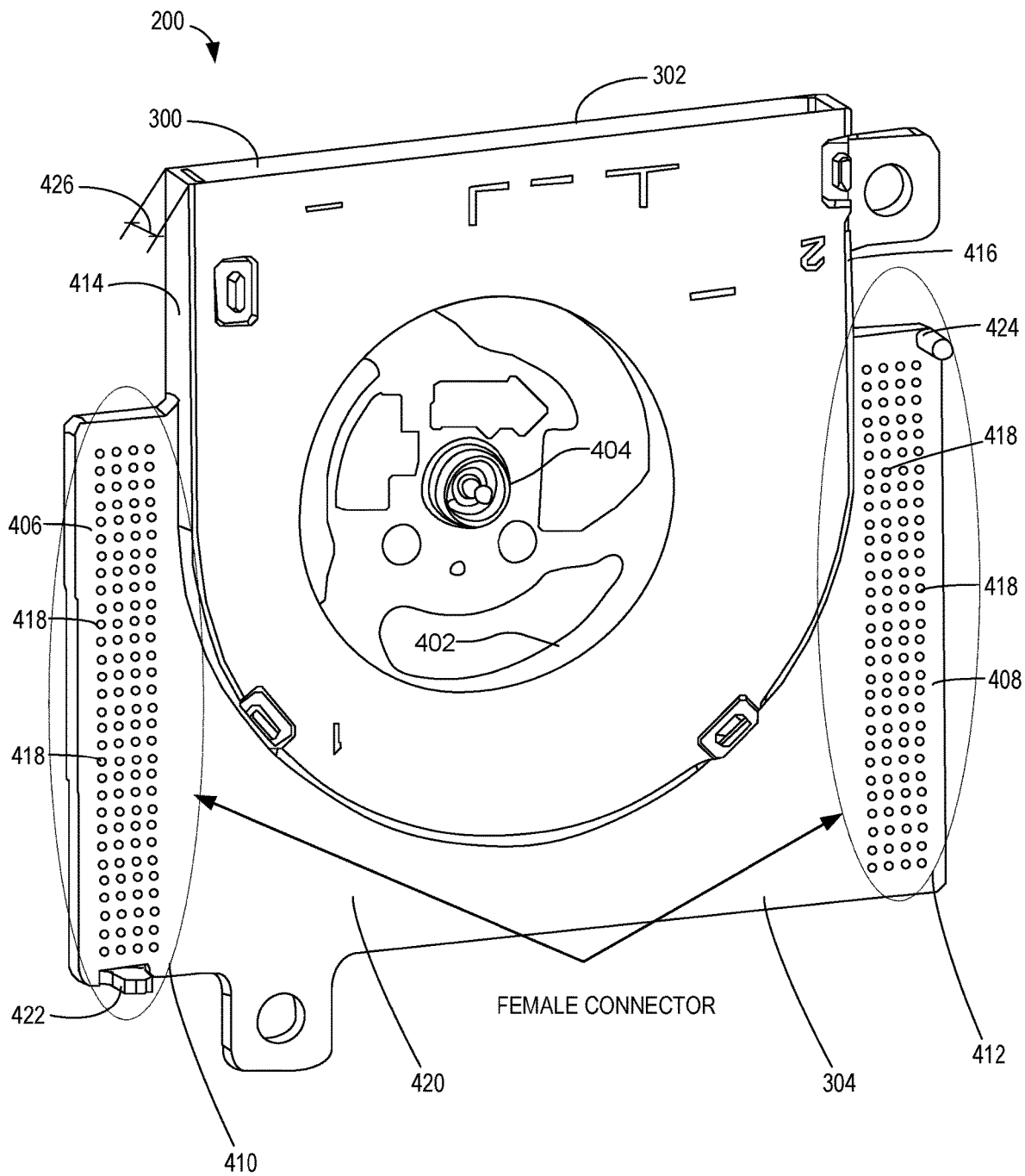
FIG. 4 is a bottom, perspective view of the example fan module of FIGS. 2 and 3.

FIG. 4 is a bottom, perspective view of the example fan module 200 of FIGS. 2 and 3. The fan 306 is removed from FIG. 4 for clarity. The fan housing 302 of the illustrated example defines a fan cavity 402 to receive the fan 306 and a hub 404 to rotatably couple the fan 306 (FIG. 3) to the fan housing 302. The fan 306 of the illustrated example rotates within the fan cavity 402 of the fan housing 302 to remove heat from the electronic components 204.

The fan module 200 of the illustrated example electrically couples to the first circuit board portion 224 and the second circuit board portion 226. To electrically couple to the first circuit board portion 224 and the second circuit board portion 226, the fan module 200 of the illustrated example includes a first electrical connector 406 and a second electrical connector 408. The first electrical connector 406 and the second electrical connector 408 of the illustrated example are carried by the body 300 of the fan module 200. Specifically, the first electrical connector 406 is formed on a first portion 410 of the flange 304 and the second electrical connector 408 is formed on a second portion 412 of the flange 304. In particular, the first electrical connector 406 is positioned adjacent a first edge 414 of the fan housing 302 and the second electrical connector 408 is positioned adjacent a second edge 416 of the fan housing 302 opposite the first edge 414. The first electrical connector 406 and the second electrical connector 408 of the illustrated example are female connectors that include a plurality of pin receptacles 418. The pin receptacles are accessible from a first surface 420 (e.g., a bottom surface) of the body 300.

To facilitate alignment of the fan module with the first circuit board portion 224 and the second circuit board portion 226, the fan module 200 of the illustrated example includes a first alignment pin 422 and a second alignment pin 424. Specifically, the first alignment pin 422 of the illustrated example is formed on the flange 304 adjacent the first electrical connector 406 and the second alignment pin 424 is formed on the flange 304 adjacent the second electrical connector 408. The first alignment pin 422 and the second alignment pin 424 of the illustrated example protrude from the first surface 420 of the flange 304 in a direction away from the first surface 420. The first alignment pin 422 defines a first keyed shape having a rectangular shape (e.g., a square shape) and the second alignment pin defines a second keyed shape having a cylindrical shape. In other examples, the first alignment pin 422 and the second alignment pin 424 can have the same shape. The fan module 200 of the illustrated example has a thickness 426 (e.g., in the z-direction) that is similar to thicknesses of conventional fan modules. In other words, the fan module 200 (e.g., the flange 304) of the illustrated example does not affect the thickness 426 of the fan module 200. In other words, the fan module 200, provided with the example interconnect 218, does not increase the thickness 426 of the fan module 200 in the z-direction.

Figure 5:
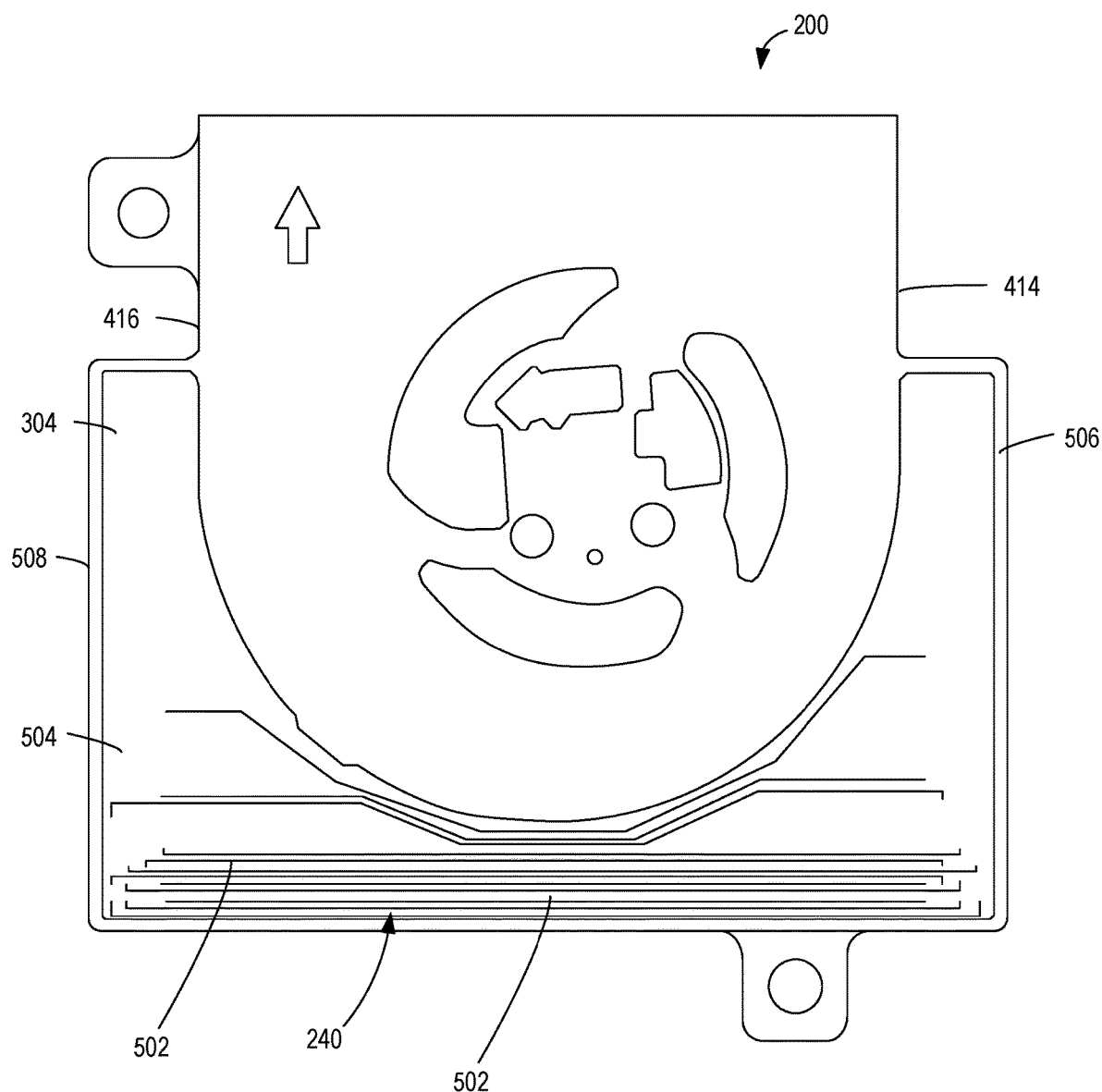
FIG. 5 is a top view of the example fan module of FIGS. 2-4.

FIG. 5 is a front view of the example fan module 200 of FIGS. 2-3. To electrically couple the first electrical connector 406 (FIG. 4) and the second electrical connector 408 (FIG. 4), the flange 304 of the illustrated example includes the plurality of third signal paths 240 (electrical signal path(s)). As noted above, the third signal paths 240 communicatively couple the first signal paths 234 (FIG. 2) (e.g., electrical signals) of the first circuit board portion 224 and the second signal paths 236 (FIG. 2) (e.g., electrical signals) of the second circuit board portion 226 when the fan module 200 is coupled to the first circuit board portion 224 and the second circuit board portion 226. The third signal paths 240 of the illustrated example are defined by one or more traces 502 formed on a second surface 504 (e.g., an upper or top surface) of the body 300 (e.g., the flange 304) opposite the first surface 420. For example, the traces 502 of the illustrated example are formed between a first flange edge 506 of the flange 304 and a second flange edge 508 of the flange 304 opposite the first flange edge 506. For example, one or more of the traces 502 electrically couple the first electrical connector 406 and the second electrical connector 408. Specifically, respective ones of the traces 502 electrically couple respective ones of the pin receptacles 418 of the first electrical connector 406 and respective ones of the pin receptacles 418 of the second electrical connector 408. Thus, the flange 304 provides the plurality of third signal paths 240 via the first electrical connector 406, the second electrical connector 408 and the traces 502.

As shown in FIG. 5, the pin receptacles 418 of the first electrical connector 406 and the pin receptacles 418 of the second electrical connector 408 do not extend through the second surface 504 of the flange 304. The pin receptacles 418 of the first electrical connector 406 and the second electrical connector 408 are accessible from the first surface 420 (e.g., the bottom surface) and partially extend in the body 300 towards the second surface 504. In some examples, the pin receptacles 418 of the first electrical connector 406 and/or the second electrical connector 408 extend through the second surface 504 (e.g., through the first surface 420 and the second surface 504). In some examples, the second mounting flange 314 can be positioned on the first flange edge 506 of the flange 304 to reduce space requirements in the y-direction.

Figure 6:
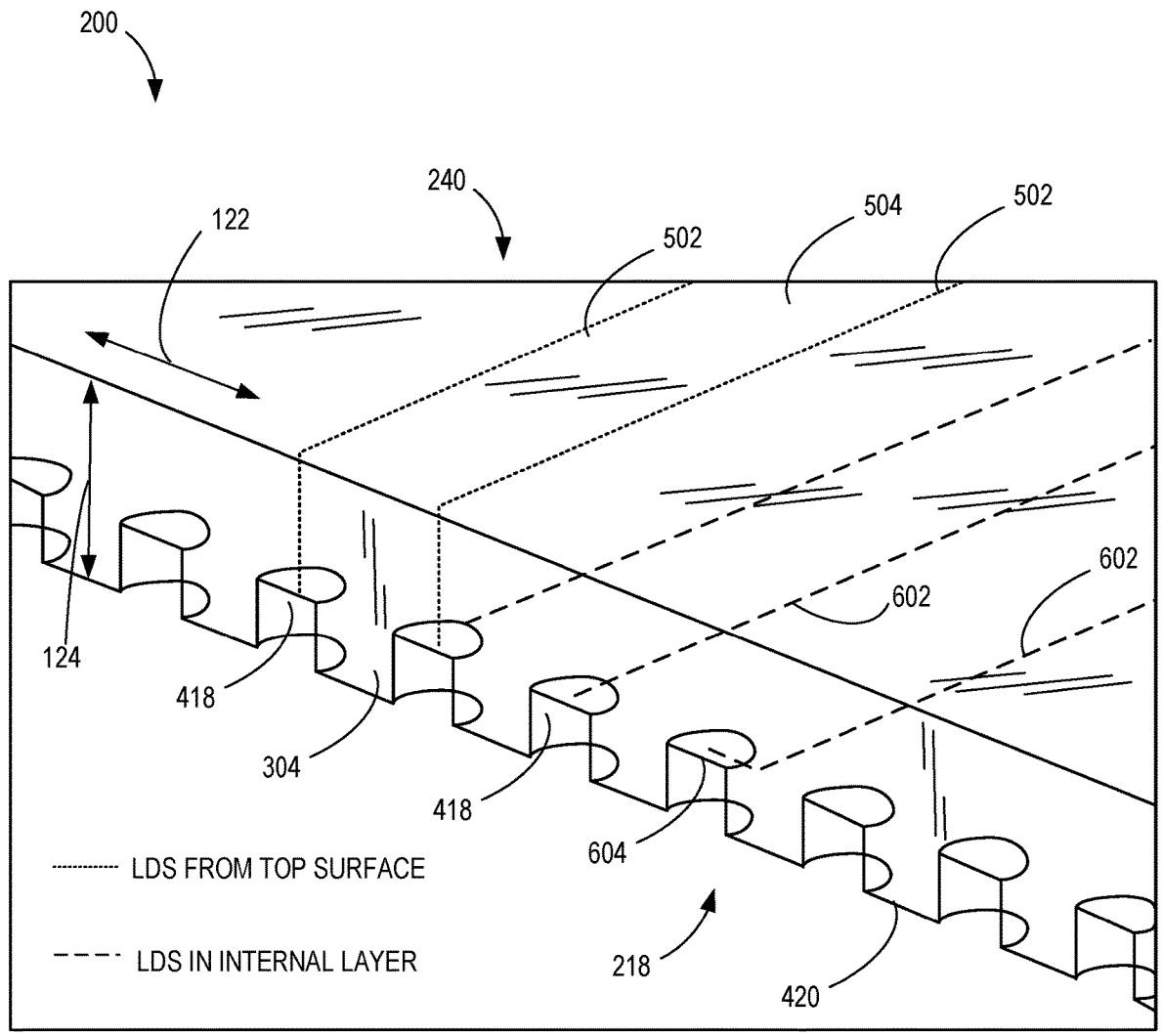
FIG. 6 is a partial, perspective view of the example fan module of FIGS. 2-5.

FIG. 6 is a partial, perspective transparent view of the fan module 200 of FIGS. 1-5. The flange 304 of the illustrated example includes a plurality of traces 602 formed on an internal surface 604 of the body 300 between the first surface 420 and the second surface 504 of the flange 304. Thus, the interconnect 218 of the illustrated example has signal paths positioned on different layers of the body 300 in the z-direction between the first surface 420 and the second surface 504. For example, the fan module 200 of the illustrated example includes the traces 502 formed on the second surface 504 and the traces 602 formed between the first surface 420 and the second surface 504. Thus, in the orientation of the z-direction (e.g., the depth 124), the traces 602 are positioned underneath the traces 502. Thus, the body 300 of the fan module 200 of the illustrated example includes the traces 502 and 602 formed on at least one of the second surface 504 of the fan module 200 or between the first surface 420 (e.g., a first outer surface) and the second surface 504 (e.g., a second outer surface) opposite the first surface 420. In some examples, the first surface 420 of the body 300 can include traces. In some examples, only the first surface 420 includes traces (e.g., the traces 502). In some examples, only the second surface 504 includes the traces 502. In some examples, only the internal surface 604 includes the traces 602.

Although the traces 602 of the illustrated example are shown on the internal surface 604, in other examples, the traces 602 can be formed on multiple internal layers between the first surface 420 and the second surface 504. Providing the traces 602 on the internal surface 604 (e.g., an internal layer) enables the traces 502 to be spaced at greater distances (e.g., horizontally in the y-direction—e.g., the height 122) provides improved spacing of circuitry, which can reduce issues of impedance or interference (e.g., crosstalk) that may occur between adjacent signal paths that are spaced too closely and thereby improve signaling of the circuitry. For example, crosstalk may be noise induced by one signal along a first signal path that interferes with another signal of another signal path.

The traces 502 and 602 define the third signal paths 240 of the interconnect 218 and electrically couple to (e.g., the pin receptacles 418 of) the first electrical connector 406 and the second electrical connector 408. For example, the third signal paths 240 of the illustrated example are defined by one or more traces 502 formed on at least one of the second surface 504 or one or more traces 602 formed on the internal surface 604 of the flange 304. In some examples, example third signal paths 240 or traces 502, 602 can be printed within multiple layers of the fan module 200 and are capable of forming different signal design rules (e.g., stripline, dual stripline, high-speed differential type signal, grounding for isolation, signal references, a combination thereof, etc.). In some examples, the third signal paths 240 disclosed herein can be laminated and used as an electrical signal path when the fan module 200 is assembled with the electronic device 100, where the fan module 200 or the flange 304 electrically connects the first circuit board portion 224 and the second circuit board portion 226 of the electronic device 100.

Referring to FIGS. 2-6, the body 300 (e.g., the fan housing 302 and the flange 304) is integrally formed as a one-piece structure. Additionally, the body 300 of the illustrated example is formed of a non-electrically conductive material(s) and the third signal paths 240 (e.g., the pin receptacles 418, the traces 502 and/or the traces 602) of the illustrated example are composed of an electrically conductive material. For example, the body 300 can be composed of a thermoplastic or resin material(s) including, but not limited to, polycarbonate (PC), acrylonitrile butadiene styrene (ABS), polyetherimide (PEI), and/or any other nonconductive material(s). The third signal paths 240 can be composed of an electrically conductive material(s) such as, for example, copper foil, aluminum foil, gold foil, etc. Thus, the fan module 200 of the illustrated example can be a molded interconnect device (MID) (e.g., an injection-molded thermoplastic part with integrated electronic circuit traces). For example, the body 300 of the illustrated example can be formed via injection molding (e.g., a one-shot injection molding, a two-shot injection molding, etc.) with laser direct structuring additives, and the traces 502 and/or the traces 602 can be formed via laser direct structuring (LDS) manufacturing techniques. In some examples, the fan module 200 (e.g., the body 300, the first electrical connector 406, the second electrical connector 408, the traces 502 and the traces 602) can be formed via additive manufacturing techniques (e.g., 3-D printing) such as, for example, selective laser sintering (SLS), stereolithography (SLA), conventional printed circuit board (PCB) fabrication technology, and/or any combination, and/or any other suitable manufacturing technology. In some examples, the traces 502 and/or 602 can be replaced by wires that are overmolded with the body 300. In some examples, the fan module 200 and the circuit board 206 can be formed as a unitary structure via, for example, additive manufacturing techniques.

For example, the body 300 (e.g., a molded interconnect device (MID) of the fan module 200 is formed via injection molding using nonconductive material having laser direct sintering (LDS) additives or (LDS) catalysts. For multi-layer structures such as the interconnect 218 of FIGS. 2-6, the body 300 is formed via a two-shot injection molding method: a first shot injection molding process to form the traces 602 on the internal surface 604 and a second shot injection molding process to form the traces 502 on the second surface 504. For example, a first shot injection molding process forms portions of the body 300 such that the internal surface 604 is exposed. In other words, the body 300 with the internal surface 604 is formed prior to formation of the outer surface 504. A laser direct sintering process is subsequently performed to prepare the internal surface 604 for metal deposition (e.g., to produce the traces 602). For example, one or more lasers etch the internal surface 604 (e.g., a plastic surface) with a pattern of the traces 602 to expose the (LDS) catalyst and create a "coral-like" structure to provide a foundation for adhesion of a conductive material (e.g., metal, copper, etc.) to the internal surface 604 (e.g., a plastic surface). Next, a plating technique is performed to apply a conductor (e.g., a conductive material) onto the internal surface 604. For example, electroless and/or electrolytic plating can be used to deposit conductive material onto the lasered area of the internal surface 604.

To prepare additional layers of traces after formation of the internal surface 604, a second shot of injection molded material is applied to the body 300 over the internal surface 604 to form the second surface 504 (e.g., such that the internal surface 604 is positioned between the first surface 420 and the second surface 504). A laser direct sintering process is performed to the outer surface 504 for metal deposition (to produce the traces 502). For example, one or more lasers etch a pattern of the traces 502 on the outer surface 504 (e.g., a plastic surface) to expose the (LDS) catalyst and create a "coral-like" structure to provide a foundation for adhesion of a conductive material (e.g., metal, copper, etc.) to the outer surface 504 (e.g., a plastic surface). Next, a plating technique is performed to apply a conductor (e.g., a conductive material) onto the outer surface 504. For example, electroless and/or electrolytic plating can be used to deposit conductive material onto the lasered area of the outer surface 504. To complete the layer structure (e.g., the flange 304), a solder resist can be applied on a trace surface. A drilling process is then performed to form the pin receptacles 418.

The above process can be repeated to perform multiple layers (e.g., four layers, five, layers, etc.). In some examples, the process is performed a single time to form the traces 502 on the outer surface 504 when the traces 602 are not formed. In some examples, the laser sintering process, the plating process and the application of resist can be performed to form traces on the first surface 420. In some examples, the traces 502 and/or 602 (and/or any other traces) can be formed via a flex circuit that is coupled to the first surface 420, the second surface 504 and/or the internal surface 604.

The traces 502 and/or 602 can have fine-pitch traces as small as 0.15 millimeters with high dense patterns to connect to the first electrical connector 406 and the second electrical connector 408. The connection density of more than 100 signals (e.g., estimate based on industry interconnect capability of 1.27 millimeter pitch to pitch, and 0.4 millimeter pin size). The electrical signal traces 502 and/or 602 can be printed on a non-linear surface (e.g., non-flat surface or a curved surface, a fan chassis surface, etc.). The traces 502 and/or 602 can be formed as copper traces providing electrical signal paths on a fan chassis (e.g., the flange 304). In some examples, a dielectric such as a resin made to compose the fan body 300 can be used to separate the traces 502 and/or 602 to avoid electrical conduction between adjacent traces and/or to a frame, chassis, or other parts composed of metal. The traces 502 and/or 602 can be laminated printed trace can be used for all types of signals with proper isolation. In some examples, the traces 502 and/or 602 are fine-pitch traces as small as 0.15 millimeters with highly dense patterns. In some examples, the traces 502 and/or 602 can be formed with multilayers on the fan body 300 with laminated dielectric therebetween. In some examples, the traces 502 and/or 602 can be printed to form different signal design rules (example: stripline, dual stripline and high-speed differential type signal and grounding for isolation and signal referencing, etc.). In some examples, solder resist is applied at surfaces of the traces 502 and/or 602. In some examples, the fan module 200 can be fastened (e.g., the fasteners 312, 316) into a frame or chassis of the second housing 104 and/or the electronic device 100 to provide a grounding path through the frame or chassis of the electronic device 100.

Figure 7A:
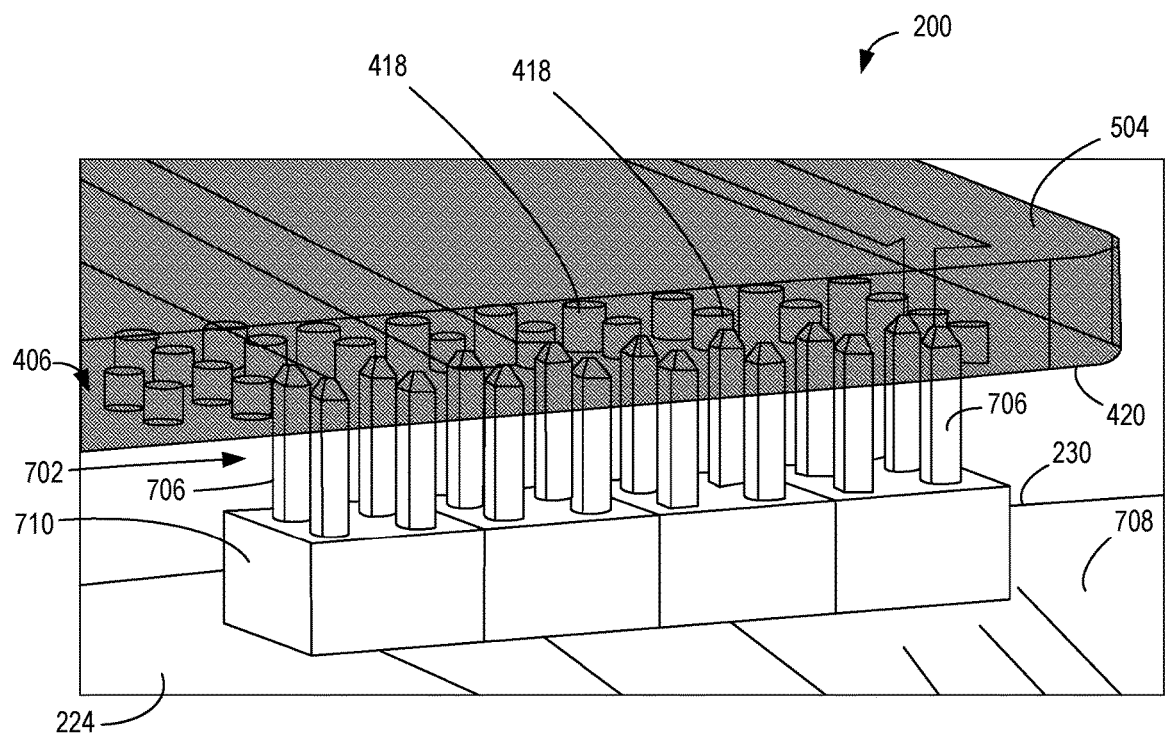
FIG. 7A is partial, perspective view of the example fan module and an example first circuit board of the example electronic device of FIG. 1.
Figure 7B:
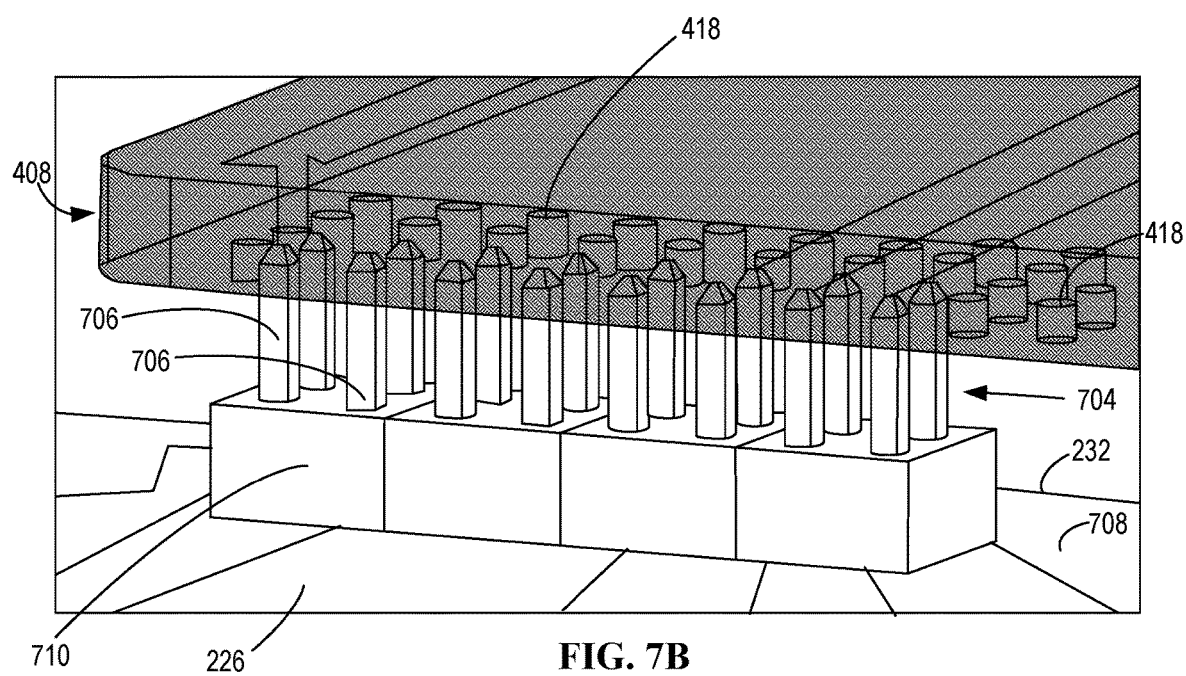
FIG. 7B is partial, perspective view of the example fan module and an example second circuit board of the example electronic device of FIG. 1.

FIG. 7A is a partial, exploded view of the example first circuit board portion 224 and the fan module 200. FIG. 7B is a partial, exploded view of the example second circuit board portion 226 and the fan module 200. To electrically couple the first circuit board portion 224 and the fan module 200, the first circuit board portion 224 of the illustrated example includes a third electrical connector 702. To electrically couple the second circuit board portion 226 and the fan module 200, the second circuit board portion 226 of the illustrated example includes a fourth electrical connector 704. The third electrical connector 702 is located adjacent the first edge 230 of the first circuit board portion 224 and the fourth electrical connector 704 is located adjacent the second edge 232 of the second circuit board portion 226.

The first electrical connector 406 of the fan module 200 of the illustrated example is structured to electrically couple to third electrical connector 702 of the first circuit board portion 224. Similarly, second electrical connector 408 of the fan module 200 of the illustrated example is structured to electrically couple to fourth electrical connector 704 of the second circuit board portion 226 when the fan module 200 couples to the first circuit board portion 224 and the second circuit board portion 226. For example, the third electrical connector 702 and the fourth electrical connector 704 of the illustrated example include a plurality of pins 706 (e.g., male connectors). The third electrical connector 702 and the fourth electrical connector 704 are formed on outer surfaces 708 (e.g., upper surfaces) of the first circuit board portion 224 and the second circuit board portion 226, respectively. In particular, the pins 706 protrude from a base 710 in a direction away from the outer surfaces 708. The pins 706 are made of an electrically conductive material. The base 710 can be made of a non-conductive material (e.g., plastic).

The first electrical connector 406 of the illustrated example aligns with the third electrical connector 702 and the second electrical connector 408 of the illustrated example aligns with the fourth electrical connector 704. In particular, the pin receptacles 418 of the first electrical connector 406 receive the pins 706 of the third electrical connector 702 and the pin receptacles 418 of the second electrical connector 408 receive the pins 706 of the fourth electrical connector 704. Thus, the third electrical connector 702 can have a number of pins 706 that does not exceed a number of pin receptacles 418 of the first electrical connector 406, and the fourth electrical connector 704 can have a number of pins 706 that does not exceed a number of pin receptacles 418 of the second electrical connector 408. For example, each of the first electrical connector 406 and the second electrical connector 408 includes 128-pin receptacles. The third electrical connector 702 and the fourth electrical connector 704 each include 16-pins. Thus, the first electrical connector 406 and/or the second electrical connector 408 can receive additional connectors of the first circuit board portion 224 and/or the second circuit board portion 226.

Figure 8:
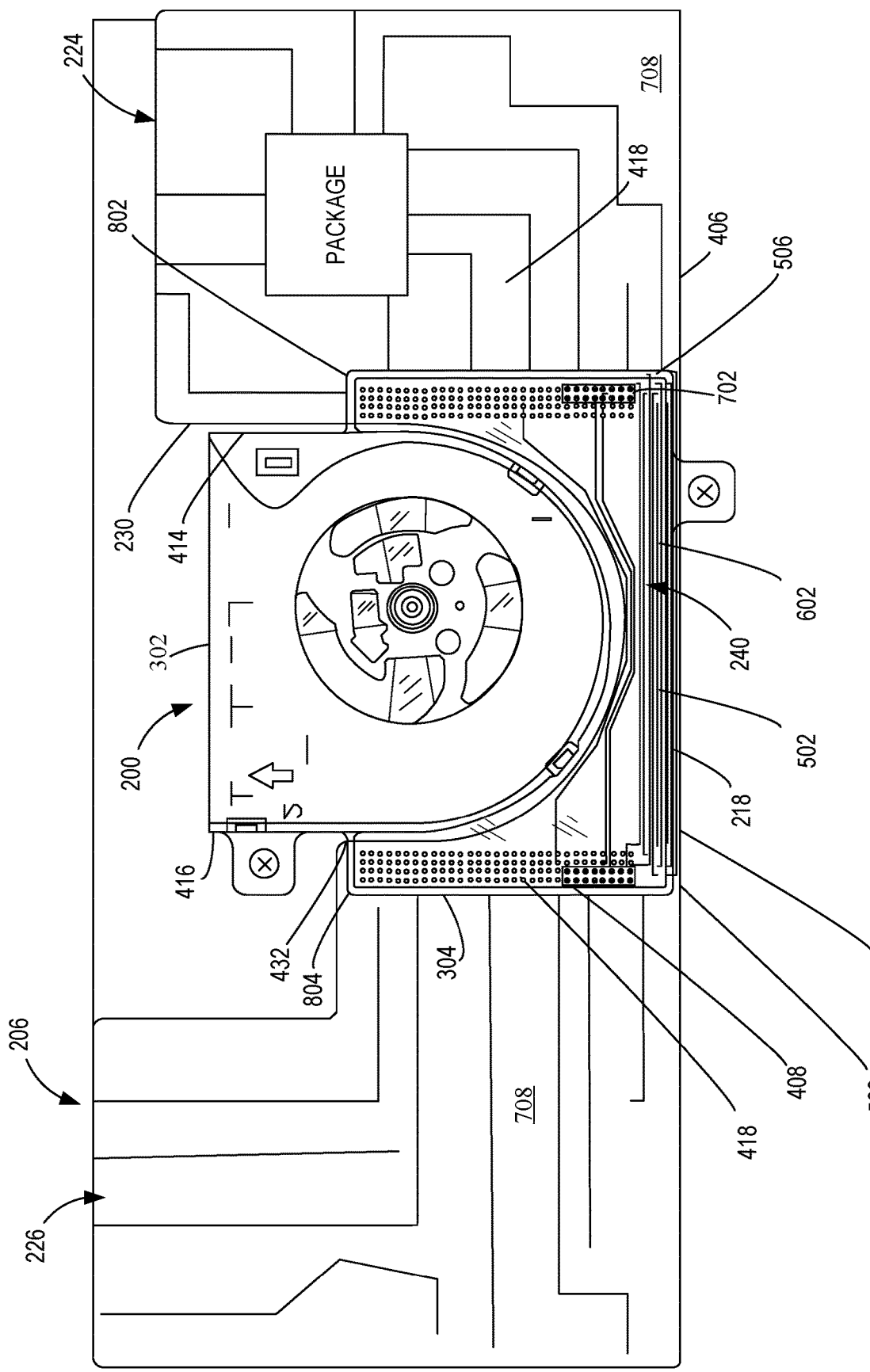
FIG. 8 is a top view of the example fan module coupled to the example first circuit board and the example second circuit board of FIGS. 1-6, 7A and 7B.

FIG. 8 is a top view of the example circuit board 206 of FIGS. 2-6, 7A and 7B. The flange 304 is shown partially transparent in FIG. 8. When the fan module 200 is coupled to the first circuit board portion 224 and the second circuit board portion 226, the third electrical connector 702 of the first circuit board portion 224 couples to the first electrical connector 406 of the fan module 200 and the fourth electrical connector 704 of the second circuit board portion 226 couples to the second electrical connector 408 of the fan module 200. In the illustrated example, the first electrical connector 406 aligns with the third electrical connector 702 and the second electrical connector 408 aligns with the fourth electrical connector 704. When the fan module 200 is coupled to the first circuit board portion 224 and the second circuit board portion 226, the first edge 414 of the fan housing 302 is adjacent (e.g., spaced away from) the first edge 230 of the first circuit board portion 224 and the second edge 416 of the fan housing 302 is adjacent (e.g., spaced away from) the second edge 432 of the second circuit board portion 226. Additionally, a first portion 802 of the flange 304 defining the first electrical connector 406 overlaps the first circuit board portion 224 such that the first flange edge 506 of the flange 304 extends over the outer surface 708 of the first circuit board portion 224 to align the first electrical connector 406 and the third electrical connector 702, and a second portion 804 of the flange 304 defining the second electrical connector 408 overlaps the second circuit board portion 226 such that the second flange edge 508 of the flange 304 extends over the outer surface 708 of the second circuit board portion 226 to align the second electrical connector 408 and the fourth electrical connector 704.

In the illustrated example, the pin receptacles 418 of the first electrical connector 406 receive the pins 706 (FIG. 7) of the third electrical connector 702 and the pin receptacles 418 of the second electrical connector 408 receive the pins 706 (FIG. 7) of the fourth electrical connector 704. As a result, the traces 502 and 602, the first electrical connector 406, and the second electrical connector 408, interconnect one or more of the first signal paths 234 of the first circuit board portion 224 and one or more of the second signal paths 236 of the second circuit board portion 226 when the first electrical connector 406 electrically couples to the third electrical connector 702 and the second electrical connector 408 electrically couples to the fourth electrical connector 704. Because the pin receptacles 418 and the pins 706 are composed of electrically conductive material(s), the first electrical connector 406 and the third electrical connector 702 electrically couple the first signal paths 234 and the third signal paths 240 of the interconnect 218, and the second electrical connector 408 and the fourth electrical connector 704 electrically couple the second signal paths 236 and the third signal paths 240 of the interconnect 218, thereby electrically coupling the first signal paths 234 and the second signal paths 236 via the third signal paths 240 of the interconnect 218. In some examples, the fan module 200 can be configured or structured to electrically couple to the circuit board 206 without the first electrical connector 406, the second electrical connector 408, the third electrical connector 702 and the fourth electrical connector 704. Instead, the third signal paths 240 (e.g., the traces 502, 602) can be directly coupled to the circuit board 206 via soldering.

Example methods, apparatus, systems, and articles of manufacture to provide interconnect mechanisms are disclosed herein. From the foregoing apparatus, the example fan module 200 disclosed herein provides a bridging interconnect between the system boards in the an electronic system (e.g., a personal computer, a laptop, a mobile device, etc.) so that the interconnect 218 creates additional space (e.g., in the y-direction) to provide thermal performance headroom for the electronic system, facilitates miniaturization or reduction of a printed circuit board, and/or provides flexibility for improving optimization of component space of an electronic system.

Further examples and combinations thereof include the following:

Example 1 includes a fan module including a fan and a fan housing to carry the fan. The fan is to rotate in the fan housing. A flange extends from the fan housing and including signal paths to provide an interconnect to electrically couple at least portions of a first electrical circuit and a second electrical circuit of an electronic device.

Example 2 includes the fan module of example 1, where the flange includes a plurality of electrical signal paths to communicatively couple electrical signal paths of a first portion of a circuit board and electronical signal paths of a second portion of the circuit board defining an electrical circuit of the electronic device.

Example 3 includes the fan module of example 2, where the electrical signal paths are defined by one or more traces formed on at least one of an outer surface or an internal surface of the flange.

Example 4 includes the fan module of example 3, where the flange includes a first electrical connector and a second electrical connector.

Example 5 includes the fan module of example 4, where at least one trace electrically couples the first electrical connector and the second electrical connector.

Example 6 includes the fan module of example 1, where at least one of the fan housing or the flange includes a mounting flange to mount the fan module to at least one of a circuit board or a frame of the electronic device.

Example 7 includes the fan module of example 1, where the fan housing and the flange are integrally formed as a one-piece structure.

Example 8 includes a fan module including a body to carry a fan. A plurality of traces is formed on a surface of the body. A first electrical connector carried by a first portion of the body and a second electrical connector is carried by a second portion of the body. The first electrical connector and the second electrical connector are electrically coupled via the traces.

Example 9 includes the a fan module of example 8, where the fan module is positioned between a first circuit board portion and a second circuit board portion, the first circuit board portion having a third electrical connector adjacent a first edge and the second circuit board portion having a fourth electrical connector adjacent a second end.

Example 10 includes the a fan module of example 9, where the first electrical connector of the fan module is structured to electrically couple to the third electrical connector, and wherein the second electrical connector is structured to electrically couple to the fourth electrical connector when the fan module is coupled to the first circuit board portion and the second circuit board portion.

Example 11 includes the a fan module of example 10, where the body of the fan module includes a plurality of traces.

Example 12 includes the a fan module of example 11, where the traces, the first electrical connector and the second electrical connector are to interconnect one or more first signal paths of the first circuit board portion and one or more second signal paths formed on the second circuit board portion when the first electrical connector is electrically coupled to the third electrical connector and the second electrical connector is electrically coupled to the fourth electrical connector.

Example 13 includes an electronic device including a first circuit board portion, a second circuit board portion, and a fan module positioned at least partially between and coupled to the first circuit board portion and the second circuit board portion. The fan module provides an interconnect that electrically couples a first signal path of the first circuit board portion and a second signal path of the second circuit board portion.

Example 14 includes the electronic device of example 13, where the fan module includes a third signal path to electrically couple the first signal path and the second signal path.

Example 15 includes the electronic device of example 14, where the first signal path, the second signal path and the third signal path define an electrical circuit of the electronic device.

Example 16 includes the electronic device of example 15, where the third signal path is a trace composed of an electrically conductive material and the fan module is composed of a thermoplastic material.

Example 17 includes the electronic device of example 16, where the trace is formed on at least one of an outer surface of the fan module or between a first outer surface and a second outer surface opposite the first outer surface.

Example 18 includes the electronic device of example 15, where the fan module includes: a casing to carry a fan; and a flange extending from the casing, the flange having a first connector and a second connector.

Example 19 includes the electronic of claim 18, where the first circuit board portion has a third connector to couple to the first connector of the fan module and the second circuit board portion has a fourth connector to couple to the second connector of the fan module.

Example 20 includes the electronic device of example 19, where the first connector and the second connector include a plurality of pin receptacles and the third connector and the fourth connector include a plurality of pins.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A fan module comprising:
   a fan;
   a fan housing to carry the fan, the fan to rotate in the fan housing to remove heat from electronic components of a circuit board; and
   a flange extending from the fan housing, the flange including:
      one or more electrically conductive traces on at least one of an outer surface or an internal surface of the flange, the one or more electrically conductive traces extending between a first side of the flange and a second side of the flange opposite the first side;
      a first electrical connector at the first side of the flange, the first electrical connector to electrically couple at least one of the one or more electrically conductive traces and a first electrical circuit of an electronic device; and
      a second electrical connector at the second side of the flange, the second electrical connector to electrically couple the at least one of the one or more electrically conductive traces and a second electrical circuit of the electronic device, and the one or more electrically conductive traces of the flange communicatively couple a first portion of the circuit board and a second portion of the circuit board via the first and second electrical connectors, respectively.

2. The fan module as defined in claim 1, wherein the flange is to mount the fan module to at least one of a circuit board or a frame of the electronic device.

3. The fan module as defined in claim 1, wherein the fan housing and the flange are integrally formed as a one-piece structure.

4. An electronic device comprising:
a first circuit board portion;
a second circuit board portion;
a fan;
a fan housing to carry the fan, the fan to remove heat from electronic components of at least one of the first circuit board portion or the second circuit board portion, the fan housing between the first circuit board portion and the second circuit board portion;
a plurality of traces at least one of printed, etched or laminated with a surface of the fan housing;
a first electrical connector carried by a first portion of the fan housing; and
a second electrical connector carried by a second portion of the fan housing, the first electrical connector and the second electrical connector electrically coupled via the traces, the first electrical connector to electrically couple to a third electrical connector of the first circuit board portion, and the second electrical connector to electrically couple to a fourth electrical connector of the second circuit board portion to form a circuit path between the first circuit board portion and the second circuit board portion via at least one of the traces.

5. The electronic device as defined in claim 4, wherein the first and second circuit board portions are parts of a same circuit board.

6. The electronic device as defined in claim 5, wherein the traces, the first electrical connector and the second electrical connector are to interconnect one or more first signal paths of the first circuit board portion and one or more second signal paths of the second circuit board portion when the first electrical connector is electrically coupled to the third electrical connector and the second electrical connector is electrically coupled to the fourth electrical connector.

7. An apparatus comprising:
a first circuit board portion including a first electrical connector;
a second circuit board portion including a second electrical connector;
a fan;
a fan housing to carry the fan to remove heat from electronic components of a circuit board, the fan housing at least partially between the first circuit board portion and the second circuit board portion, the fan housing including:
a flange extending from the fan housing, the flange having a third electrical connector, a fourth electrical connector, and a signal path to electrically couple the third electrical connector and the fourth electrical connector, the third electrical connector of the fan housing to electrically couple to the first electrical connector of the first circuit board portion, and the fourth electrical connector of the fan housing to electrically couple to the second electrical connector of the second circuit board portion to form a circuit between the first and second circuit board portions, wherein the first and second circuit board portions are parts of the circuit board.

8. The apparatus as defined in claim 7, wherein the signal path includes an electrically conductive material and the fan housing includes a thermoplastic material.

9. The apparatus as defined in claim 8, wherein the signal path on at least one of an outer surface of the fan housing or between a first outer surface and a second outer surface opposite the first outer surface.

10. The apparatus as defined in claim 7, wherein the first electrical connector and the second electrical connector include a plurality of pin receptacles and the third electrical connector and the fourth electrical connector include a plurality of pins.

11. The electronic device as defined in claim 4, wherein the plurality of traces are on an outer surface of the fan housing.

12. The electronic device as defined in claim 4, wherein the plurality of traces are on an internal surface of the fan housing.

13. The electronic device of claim 4, wherein the first circuit board portion is part of a first circuit board and the second circuit board portion is part of a second circuit board separate from the first circuit board.

14. The apparatus as defined in claim 7, wherein the first electrical connector and the second electrical connector include a plurality of pins and the third electrical connector and the fourth electrical connector include a plurality of pin receptacles.

* * * * *